United States Patent
Fu et al.

(10) Patent No.: US 7,391,615 B2
(45) Date of Patent: Jun. 24, 2008

(54) CLIP FOR HEAT SINK

(75) Inventors: Meng Fu, Shenzhen (CN); Shi-Wen Zhou, Shenzhen (CN); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 80 days.

(21) Appl. No.: 11/309,839

(22) Filed: Oct. 10, 2006

(65) Prior Publication Data

US 2008/0084670 A1    Apr. 10, 2008

(51) Int. Cl.
*H05K 7/20* (2006.01)

(52) U.S. Cl. .............. 361/704; 165/80.3; 165/185; 257/718; 257/719; 257/727; 24/505; 24/510

(58) Field of Classification Search ............... None
See application file for complete search history.

(56) References Cited

U.S. PATENT DOCUMENTS

| | | | |
|---|---|---|---|
| 5,771,960 A * | 6/1998 | Lin | 165/80.3 |
| 5,953,212 A * | 9/1999 | Lee | 361/709 |
| 6,418,022 B1 * | 7/2002 | Chen | 361/704 |
| 6,452,801 B1 * | 9/2002 | Chen | 361/704 |
| 6,731,504 B1 | 5/2004 | Liu | |
| 6,771,506 B2 * | 8/2004 | Lee et al. | 361/704 |
| 7,046,516 B2 * | 5/2006 | Lee et al. | 361/704 |
| 7,167,367 B2 * | 1/2007 | Zhang | 361/704 |
| 7,286,363 B2 * | 10/2007 | Lee et al. | 361/709 |

\* cited by examiner

*Primary Examiner*—Boris L Chervinsky
(74) *Attorney, Agent, or Firm*—Jeffrey T. Knapp

(57) ABSTRACT

A clip includes a body with opposite first and second legs, a movable fastener, an actuating member and a sliding axle. The movable fastener has a retaining hole defined therein for engaging with a retention module and an elongated slot above the retaining hole. The actuating member includes a curving slot and is pivotally coupled to the movable fastener via a pivot. The sliding axle extends through the second leg of the body and the elongated slot of the movable fastener to couple them together, and the sliding axle has one portion inserted into the curving slot of the actuating member. When the actuating member is rotated about the pivot, the movable fastener is driven to move relative to the sliding axle between a relaxed position and a locked position.

17 Claims, 7 Drawing Sheets

CLIP FOR HEAT SINK

FIELD OF THE INVENTION

The present invention relates to a clip for a heat sink, and more particularly to a clip which can readily and securely attach a heat sink to an electronic device.

DESCRIPTION OF RELATED ART

A heat sink is usually placed in thermal contact with an electronic package such as a central processing unit (CPU), and transfers heat through conduction away from the electronic package so as to prevent over-heating of the electronic package. Usually, a heat sink is secured to an electronic package by using a clip.

Referring to FIG. 7, a clip in accordance with related art includes a first member 1 and a second member 2 coupled to the first member 1. The clip secures a heat sink 20 to a CPU module 25 fitting into a socket 90. The first member 1 includes a spring portion 3 with a leg 4 extending from an end of the spring portion 3. The leg 4 defines a first slot 6 for engagement with a catch 91 of the socket 90. A pair of arms 5 extend from an opposite end of the spring portion 3 to define a receiving space 7 for receiving the second member 2 therein. The second member 2, which is L-shaped, comprises a handle portion 8 extending above the spring portion 3 of the first member 1 for manual operation and a lower portion opposite the leg 4 defining a second slot 10 for engaging a second catch 92 of the socket 90. The second member 2 defines a pair of notches 9 on opposite sides thereof for engaging with the arms 5 of the first member 1, thereby connecting the first member 1 to the second member 2. The spring portion 3 is deformed to impart a spring force to the heat sink 20 for securing the heat sink 20 and the CPU module 25 to the socket 90.

However, a relatively large force is required to operate the handle portion 8 for fixing the heat sink 20 to the CPU module 25. This makes it difficult to attach and detach the clip from the socket 90.

SUMMARY OF THE INVENTION

A clip comprises a body with a first leg formed at an end thereof and a second leg formed at an opposite end thereof, a movable fastener, an actuating member and a sliding axle. The movable fastener has a retaining hole defined therein and an elongated slot above the retaining hole. The actuating member includes a curving slot and is pivotally coupled to the movable fastener via a pivot. The sliding axle extends through the second leg of the body and the elongated slot of the movable fastener to couple the movable fastener to the body, and the sliding axle has one portion inserted into the curving slot of the actuating member. When the actuating member is brought to rotate about the pivot, the movable fastener is driven to move relative to the sliding axle between a relaxed position and a locked position.

Other advantages and novel features will become more apparent from the following detailed description of preferred embodiments when taken in conjunction with the accompanying drawings, in which:

BRIEF DESCRIPTION OF THE DRAWINGS

Many aspects of the clip for heat sink can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
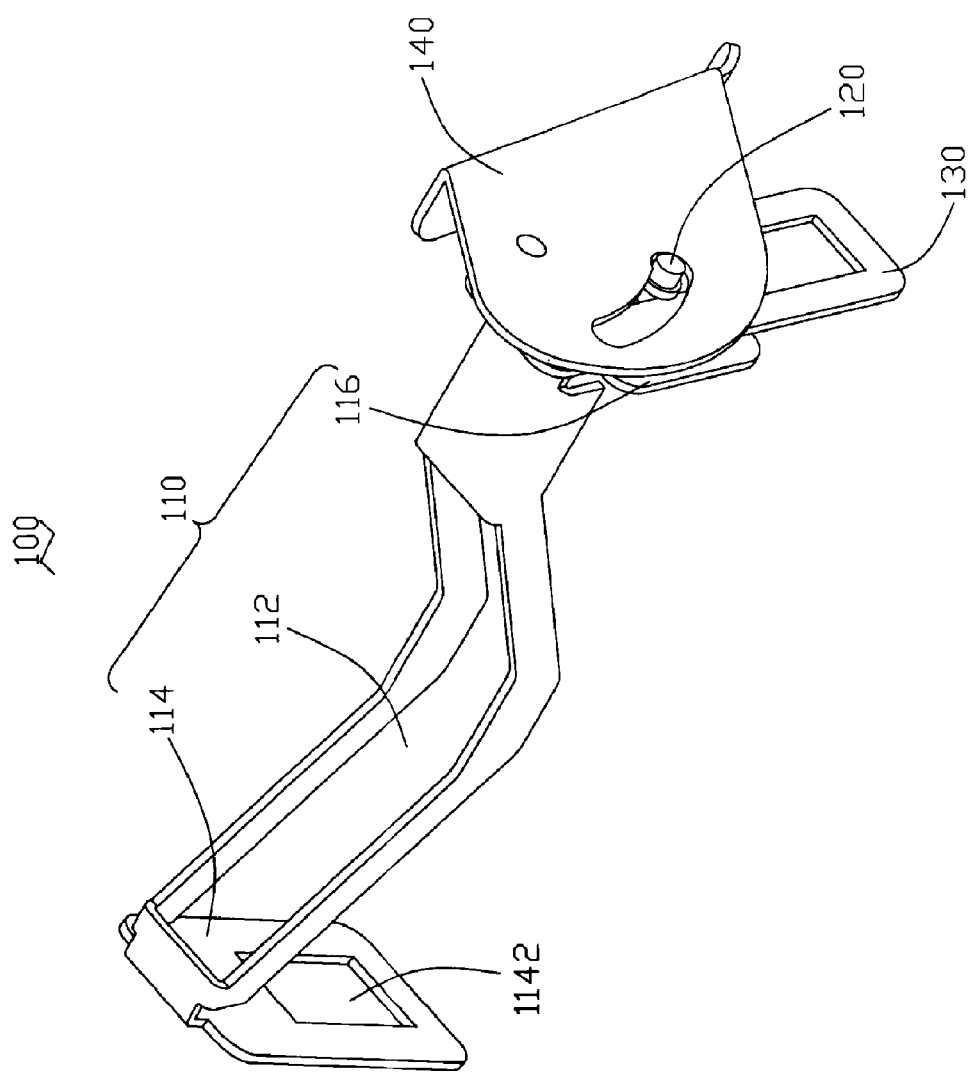
FIG. 1 is an isometric view of a clip in accordance with a preferred embodiment of the present invention.
Figure 2:
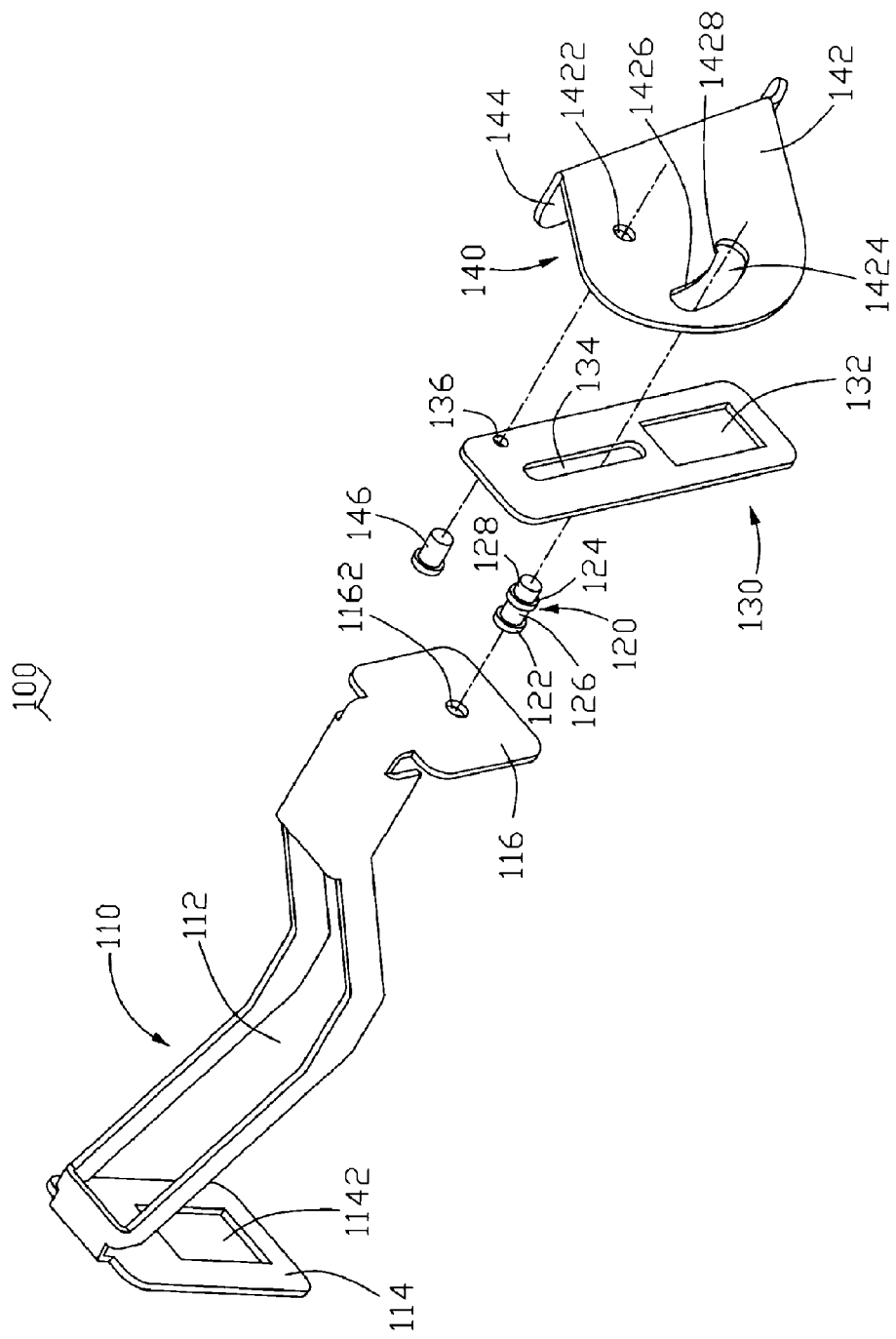
FIG. 2 is an exploded view of the clip in FIG. 1.
Figure 3:
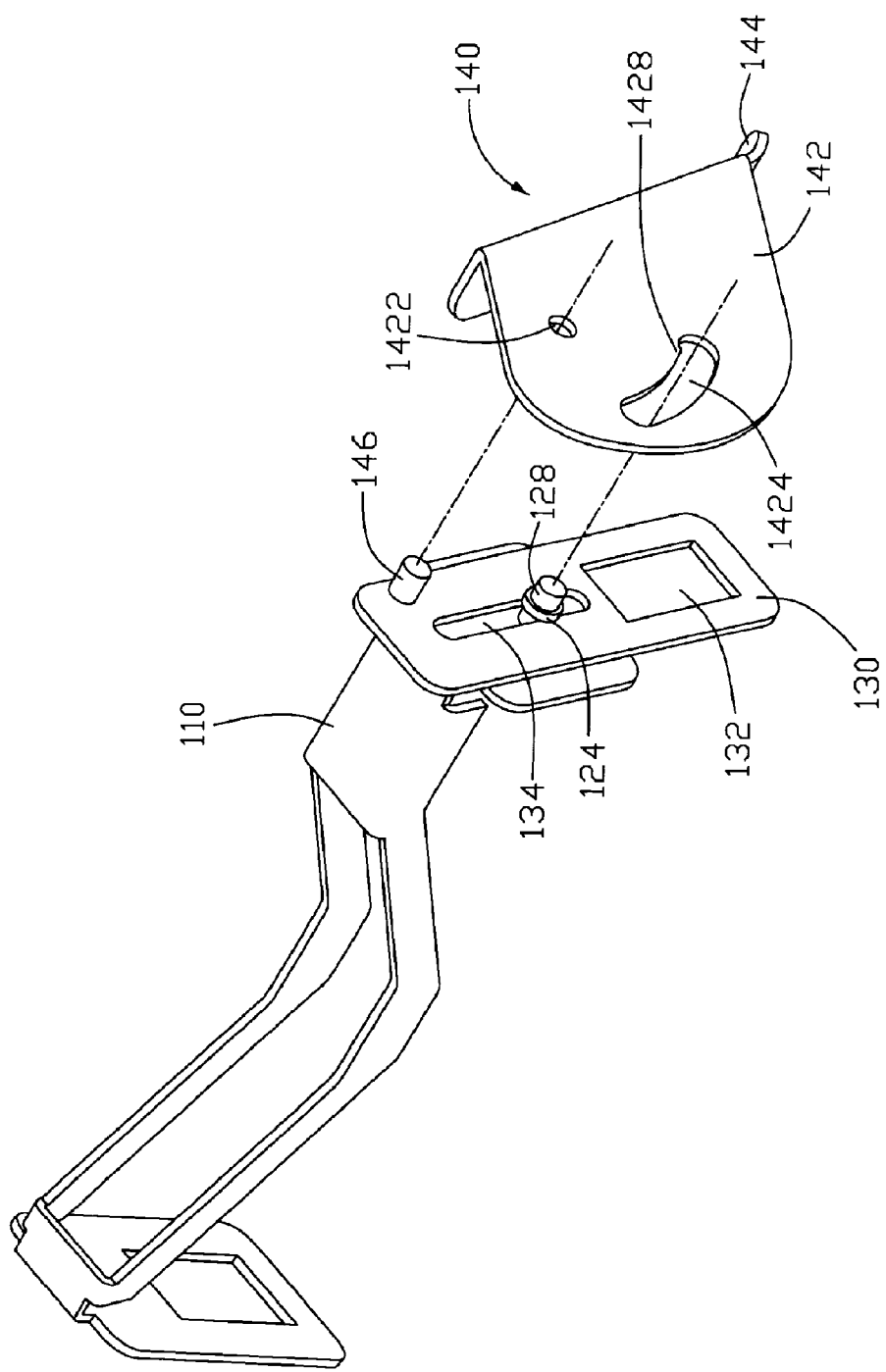
FIG. 3 is a partly assembled view of the clip in FIG. 2.

Referring to FIGS. 1-3, a clip 100 in accordance with a preferred embodiment of the present invention is illustrated. The clip 100 comprises an elongated body 110, a sliding axle 120, a movable fastener 130 and an actuating member 140.

The body 110 is a substantially V-shaped member with a slot 112 defined therein to reinforce the elasticity of the body 110. The body 110 has two legs perpendicularly and downwardly extending from opposite ends thereof, namely, a first leg 114 and a second leg 116. The first leg 114 defines a hole 1142 in a bottom portion thereof for receiving a locking member set on one side of an electronic package. The second leg 116 defines a through hole 1162 therein for the sliding axle 120 to extend therethrough.

The sliding axle 120 is a multistage body with different diameters; it comprises a first flange 122, a second flange 124, a first section 126 extending between the first flange 122 and the second flange 124, and a second section 128 extending from the second flange 124 along a direction away from the first section 126.

The sliding axle 120 is provided for coupling the body 110 to the movable fastener 130. When the second flange 124 of the sliding axle 120 is inserted from left side to right side through the through hole 1162 in the second leg 116 of the body 110, the first flange 122 is positioned at a left side of the second leg 116, and servers as a stop to prevent the sliding axle 120 from escaping from the through hole 1162 in the second leg 116. At the same time, the second flange 124 is positioned at a right side of the second leg 116 of the body 110, for engaging with the movable fastener 130.

The moveable fastener 130 is a plate member, and comprises a retaining hole 132 and an elongated slot 134 being respectively defined in opposite bottom and top sides thereof. The retaining hole 132 is used to receive and engage with another locking member set on another side of the electronic package. The elongated slot 134 extends along a vertical direction corresponding to the through hole 1162 of the body 110. The elongated slot 134 has a width larger than that of a diameter of the first section 126 of the sliding axle 120 and smaller than that of the second flange 124. Therefore, the second flange 124 of the sliding axle 120 can engage with edges of the elongated slot 134 to secure the body 110 to the movable fastener 130.

When assembling the movable fastener 130 to the body 110, the movable fastener 130 is first positioned at the second leg 116 of the body 110 with the elongated slot 134 thereof aligned over the through hole 1162 of the second leg 116. Then, the second flange 124 of the sliding axle 120 is inserted from left side to right side through the through hole 1162 of the body 110 and the elongated slot 134 of the movable fastener 130 via elastic deformation of the second flange 124. Subsequently, the second flange 124 of the sliding axle 120 returns to its previous form and serves as a stop preventing the movable fastener 130 from disengaging from the sliding axle 120. Therefore, the second leg 116 of the body 110 and the movable fastener 130 are held between the first flange 122 and the second flange 124 of the sliding axle 120. The sliding axle 120 can move upwardly or downwardly relative to the movable fastener 130 along the elongated slot 134 of the movable fastener 130.

In this embodiment, a pivot hole 136 is defined in a corner of the movable fastener 130 above the elongated slot 134, for pivotally coupling the movable fastener 130 to the actuating member 140, which exerts a force on the second section 128 of the sliding axle 120 to cause relative movement between the sliding axle 120 and the movable fastener 130. The detailed structure of the actuating member 140 will be described in following text.

The actuating member 140 comprises a base plate 142 and a side plate 144 perpendicularly bent from one side of the base plate 142. The side plate 144 is provided for facilitating operation of the actuating member 140, and forms a handle for the actuating member 140.

The base plate 142 has a pivot hole 1422 defined therein corresponding to the pivot hole 136 of the movable fastener 130. The actuating member 140 is pivotally secured to the movable fastener 130 via a pivot 146 fastened to the pivot hole 1422 of the actuating member 140 and the pivot hole 136 of the movable fastener 130. Therefore, the actuating member 140 can rotate round the pivot 146 relative to the movable fastener 130.

The base plate 142 has a curving slot 1424 defined therein away from the pivot hole 1422 of the base plate 142, and a curving wall 1426 adjacent to the curving slot 1424. The curving wall 1426 is used for contacting the sliding axle 120 and exerting a force on the sliding axle 120. The distance between the pivot hole 1422 of the actuating member 140 and each point of the curving wall 1426 is gradually increased from a first end (not labeled, an upper end as viewed from FIG. 1) to a second end (not labeled, a lower end as viewed from FIG. 1) of the curving wall 1426.

When the actuating member 140 is pivotally coupled to the movable fastener 130, the second section 128 of the sliding axle 120 is just inserted into the curving slot 1424 of the actuating member 140. The movable fastener 130 is positioned between the second leg 116 of the body 110 and the actuating member 140. Therefore, the body 110, the movable fastener 130, and the actuating member 140 are assembled together, and the clip 100 is formed. When assembled, the side plate 144 of the actuating member 140 extends from the base plate 142 toward the elongated body 110.

When the actuating member 140 is brought to pivot around the pivot 146, the second section 128 of the sliding axle 120 will move relative to the actuating member 140 in the curving slot 1424 of the actuating member 140. As a result, the distance between the pivot 146 and the second section 128 of the sliding axle 120 can be gradually changed, e.g. decreased or increased. At the same time, the second section 128 of the sliding axle 120 is urged by the curving wall 1426 to move in the elongated slot 134 of the movable fastener 130 along the vertical direction.

Figure 4:
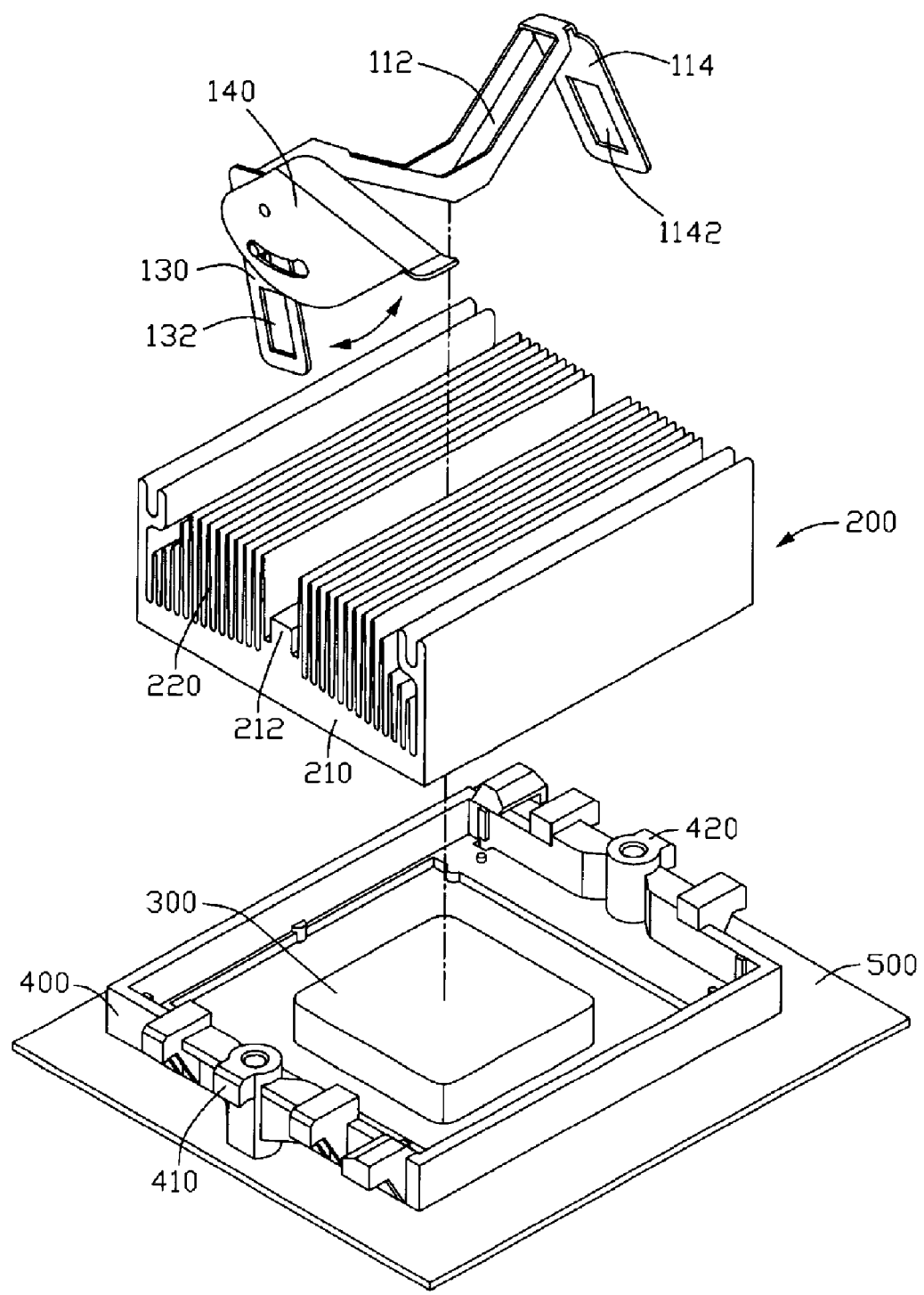
FIG. 4 is an exploded view showing the clip ready to secure a heat sink onto an electronic package.
Figure 5:
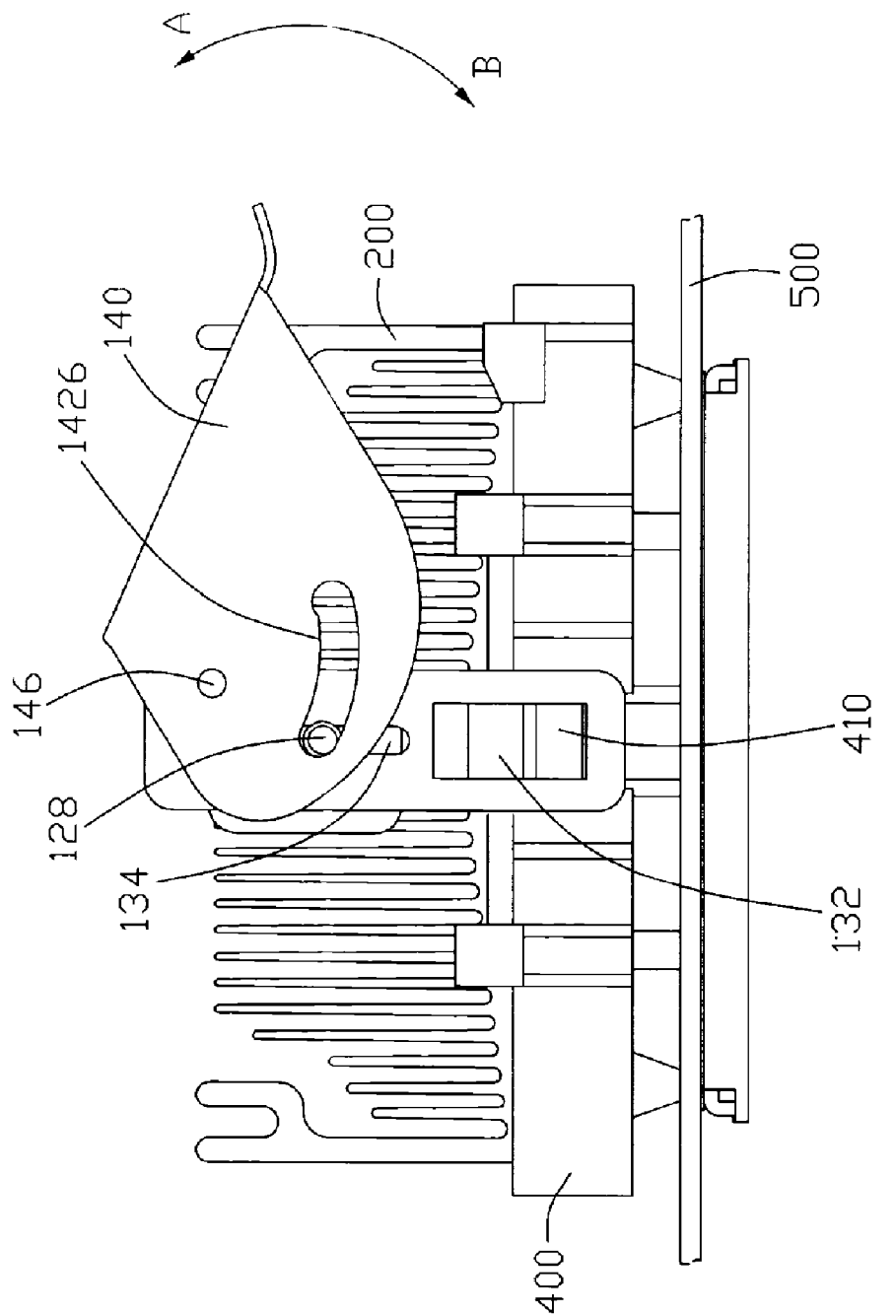
FIG. 5 is a side-elevation, assembled view of the clip and the heat sink of FIG. 4, but with an actuating member of the clip shown in a relaxed position.
Figure 6:
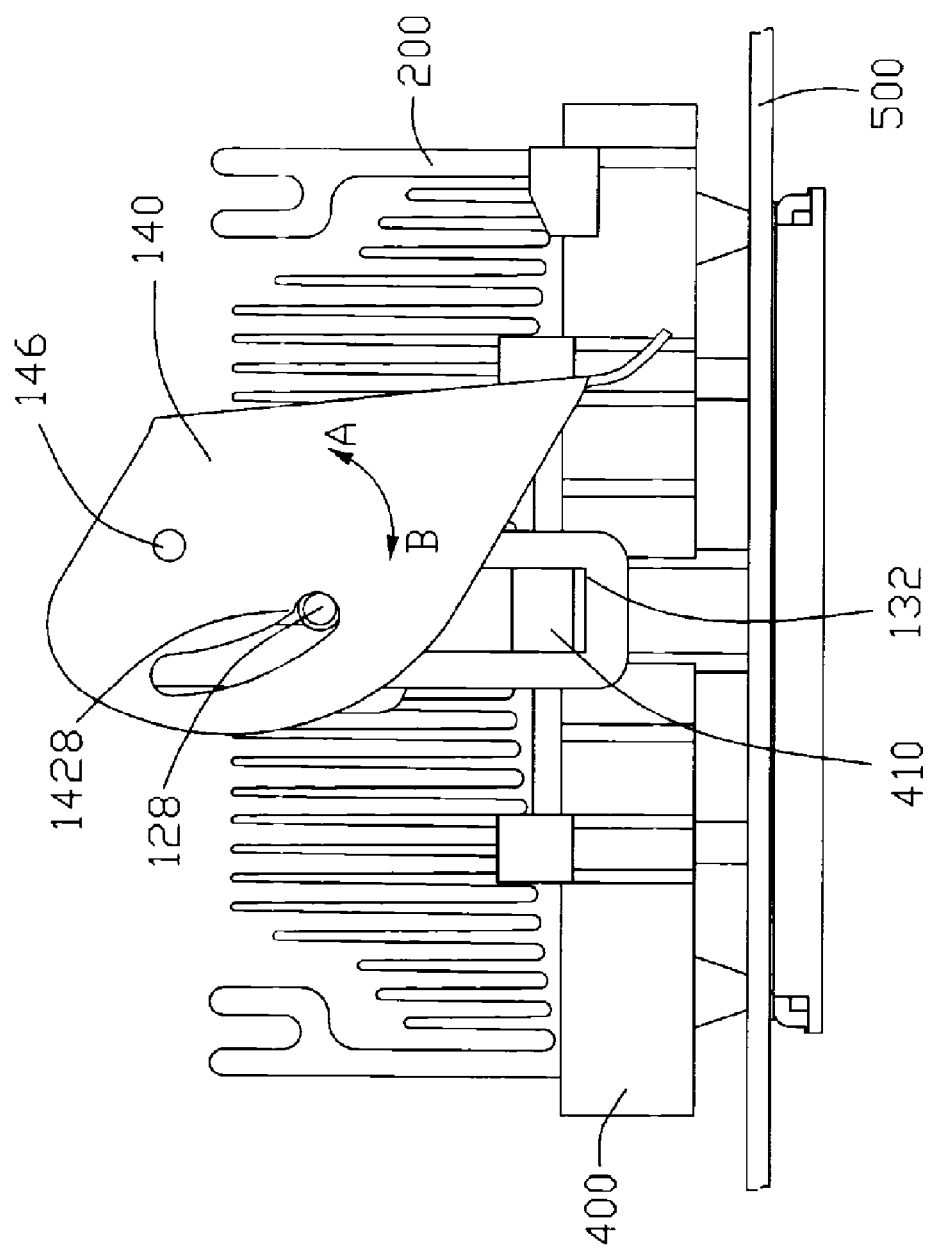
FIG. 6 is similar to FIG. 5, but with the actuating member of the clip shown in a locked position.
Figure 7:
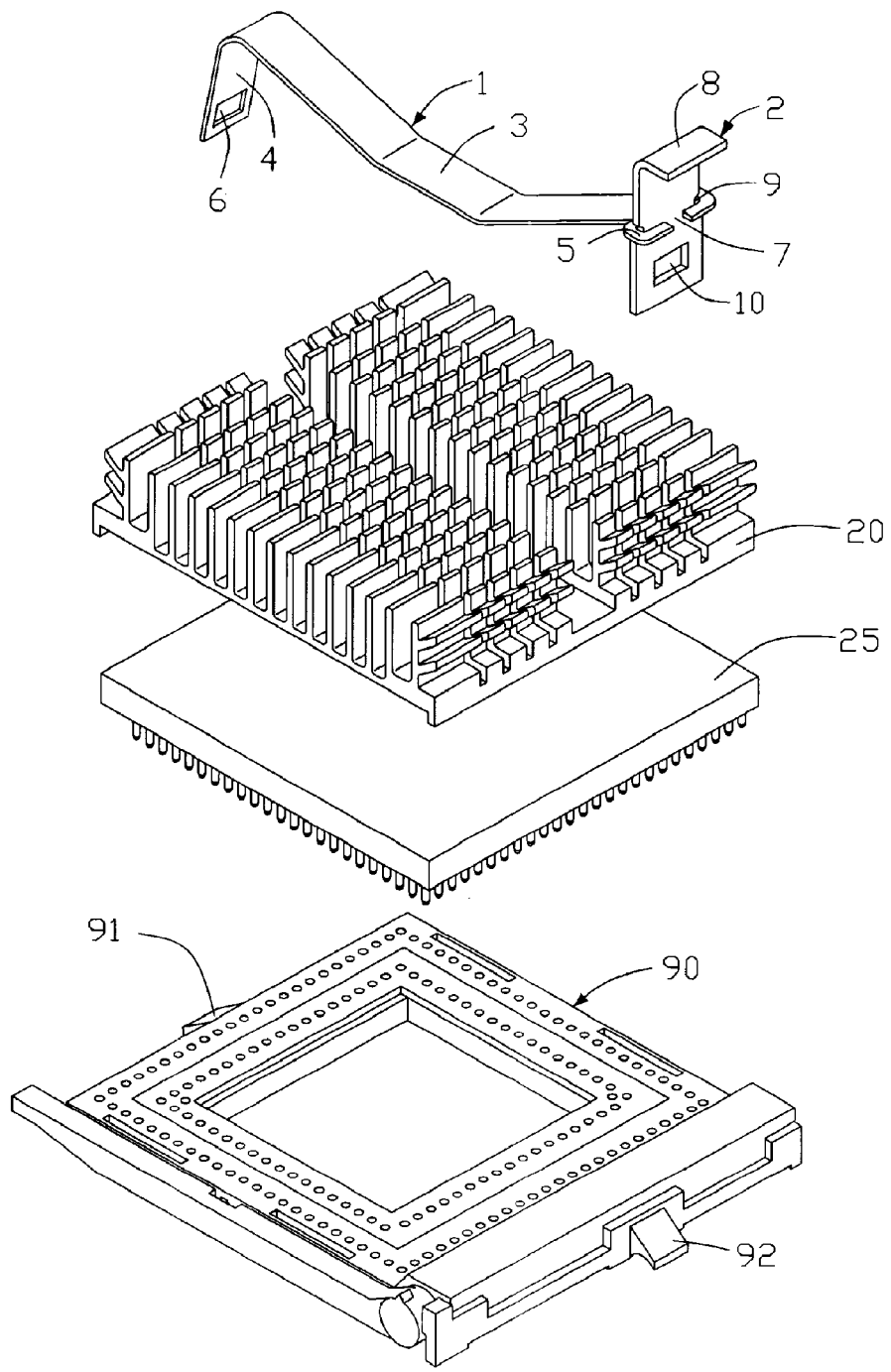
FIG. 7 is an isometric view of a clip in accordance with a related art.

Referring to FIGS. 4-6, the aforesaid clip 100 is used to attach a heat sink 200 on a top surface of an electronic package such as a CPU 300 in a retention module 400 on a motherboard 500. The heat sink 200 comprises a base 210 having a bottom surface thereof in thermal contact with the CPU 300 and a plurality of fins 220 mounted on the top surface of the base 210. A locating protrusion 212 protrudes upwardly from a top surface of the base 210 and is received in the slot 112 of the body 110 of the clip 100; thus, the clip 100 is positioned on the base 210 of the heat sink 200.

The actuating member 140 can pivot relative to the heat sink 200 around the pivot 146 along a direction A (e.g. counterclockwise) and a direction B (e.g. clockwise) opposite to the direction A to thereby move between a relaxed position (shown in FIG. 5), where the distance between the pivot 146 and the second section 128 of the sliding axle 120 is smallest, and a locked position (shown in FIG. 6), where the distance between the pivot 146 and the second section 128 of the sliding axle 120 is largest. When the actuating member 140 is rotated along the direction B, the actuating member 140 is moved toward the movable fastener 130.

As shown in FIGS. 4-5, the actuating member 140 is in the relaxed position. In this relaxed position, the hole 1142 of the first leg 114 receives a protrusion 420 of the retention module 400 therein, and the retaining hole 132 of the movable fastener 130 receives a protrusion 410 of the retention module 400 therein.

In operation, the actuating member 140 is pushed downwardly along the direction B such that it pivots about the pivot 146 causing the distance between the pivot 146 and the sliding axle 120 to gradually increase. As a result, the second section 128 of the sliding axle 120 and the curving wall 1426 of the actuating member 140 act on each other to cause the actuating member 140 with the movable fastener 130 to move upwardly. At the same time, the sliding axle 120 and the second leg 116 will move downwardly, which leads to a deformation of the body 110. As the actuating member 140 is continuously pushed so that the distance between the pivot 146 and the sliding axle 120 is continuously increased, the deformation of the body 110 is gradually increased, as a result, the retaining hole 132 of the movable fastener 130 is brought to enter into engagement with the protrusion 410 of the retention module 400.

When set in the locked position, the body 110 is deformed and imparts a downward pressure onto the heat sink 200, keeping the bottom surface of the heat sink 200 in close contact with the top surface of the CPU 300. As shown in FIG. 6, the side plate 144 is oriented perpendicular to the body 110 and closely adjacent to one vertical periphery side of the heat sink 200. Thus, the installation of the clip 100 does require less space than most conventional clips, such as the clip mentioned above in the related art.

Moreover, a protrusion 1428 is formed at the base plate 142 near the second end of the curving wall 1426, and extends into the curving slot 1424. When the sliding axle 120 is at the locked position, the protrusion 1428 engages with the second section 128 of the sliding axle 120 to prevent the actuating member 140 from spontaneously returning to the relaxed position, unless the actuating member 140 is driven to rotate by a user in a direction as shown by direction A in FIG. 6. Thus it can be seen that the clip 100 stably secures the heat sink 200 onto the CPU 300.

To unlock the clip 100, the actuating member 140 is turned from the locked position to the relaxed position along the direction A opposite to the direction B. Then, the clip 100 can be easily removed from the retention module 400.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A clip comprising:
   a body comprising a first leg formed at an end thereof, adapted for engaging with a first protrusion formed on a retention module, and a second leg formed at an opposite end thereof;
   a movable fastener having a retaining hole defined therein and an elongated slot above the retaining hole, the retaining hole being adapted for receiving a second protrusion formed on the retention module;
   an actuating member pivotally coupled to the movable fastener via a pivot, the actuating member comprising a curving slot; and
   a sliding axle extending through the second leg of the body and the elongated slot of the movable fastener to couple the movable fastener to the body, the sliding axle having one portion inserted into the curving slot of the actuating member;
   wherein when the actuating member is brought to rotate about the pivot, the movable fastener is driven to move relative to the sliding axle between a relaxed position and a locked position.

2. The clip as claimed in claim 1, wherein the first leg has a hole adapted for receiving the first protrusion of the retention module therein.

3. The clip as claimed in claim 1, wherein the second leg has a through hole defined therein for the sliding axle extending therethrough.

4. The clip as claimed in claim 1, wherein the actuating member further comprises a curving wall adjacent to the curving slot, wherein a distance between the pivot and the each point of the curving wall is gradually increased from a first end to a second end of the curving wall.

5. The clip as claimed in claim 1, wherein the sliding axle comprises a first flange, a second flange, wherein the second leg of the body and the movable fastener are held between the first flange and the second flange of the sliding axle.

6. The clip as claimed in claim 5, wherein the sliding axle further comprises a first section extending between the first flange and the second flange, the first section has a diameter smaller than a width of the elongated slot of the movable fastener so that the sliding axle can move relative to the movable fastener along the elongated slot of the movable fastener.

7. The clip as claimed in claim 6, wherein the sliding axle further comprises a second section extending from the second flange along a direction away from the first section, wherein the second section is inserted into the curving slot of the actuating member.

8. The clip as claimed in claim 7, wherein when the movable fastener is in the relaxed position, a distance between the pivot and the second section of the sliding axle is smaller than a distance between the pivot and the second section of the sliding axle when the movable fastener is in the locked position.

9. The clip as claimed in claim 7, wherein the actuating member further comprises a protrusion extending into the curving slot thereof, for engaging with the second section of the sliding axle when the movable fastener is in the locked position.

10. The clip as claimed in claim 1, wherein the movable fastener is positioned between the second leg of the body and the actuating member.

11. The clip as claimed in claim 1, wherein a slot is defined in the body to increase elasticity of the body.

12. The clip as claimed in claim 1, wherein when the actuating member is brought to rotate relative to the movable fastener, the sliding axle moves in the elongated slot of the movable fastener and the curving slot of the actuating member simultaneously.

13. A heat sink assembly, comprising:
    a heat sink;
    first and second engaging means provided at opposite sides of the heat sink; and
    a clip comprising:
    a body supported on the heat sink, the body having a first end terminating in a first leg for engaging with the first engaging means, and a second end terminating in a second leg;
    a movable fastener having a retaining hole defined therein for engaging with the second engaging means and an elongated slot above the retaining hole;
    an actuating member pivotally coupled to the movable fastener at a point, the actuating member comprising a curving slot away from the point; and
    a sliding axle extending through the second leg of the body and the elongated slot of the movable fastener to couple the movable fastener to the body, the sliding axle having one portion inserted into the curving slot of the actuating member;
    wherein when the actuating member is brought to rotate relative to the movable fastener, the movable fastener is driven to move relative to the sliding axle between a relaxed position and a locked position, where the retaining hole of the movable fastener securely engages with the second engaging means.

14. The heat sink assembly as claimed in claim 13, wherein when the actuating member is brought to move towards the movable fastener, the movable fastener is driven to move from the relaxed position to the locked position.

15. The heat sink assembly as claimed in claim 13, wherein when the movable fastener is driven to move from the relaxed position to the locked position, the sliding axle moves in the elongated slot of the movable fastener and the curving slot of the actuating member simultaneously.

16. The heat sink assembly as claimed in claim 13, wherein the sliding axle comprises a first portion connecting to the second leg of the body, a second portion engaging with the elongated slot of the movable fastener to couple the movable fastener to the body, and a third portion being positioned into the curving slot of the actuating member.

17. The heat sink assembly as claimed in claim 16, wherein the actuating member has a base plate defining the curving slot therein and a side plate extending from the base plate toward the body, the side plate being adapted for receiving a rotation force for bringing the actuating member to rotate.

* * * * *